United States Patent
Roy et al.

(10) Patent No.: US 10,312,899 B2
(45) Date of Patent: Jun. 4, 2019

(54) OVER-VOLTAGE CLAMP CIRCUIT

(71) Applicant: Texas Instruments Incorporated, Dallas, TX (US)

(72) Inventors: Subrato Roy, Bangalore (IN); Dattatreya Baragur Suryanarayana, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/916,979

(22) Filed: Mar. 9, 2018

(65) Prior Publication Data

US 2018/0262188 A1    Sep. 13, 2018

(30) Foreign Application Priority Data

Mar. 9, 2017 (IN) .............................. 201741008245

(51) Int. Cl.
  *H03K 17/082* (2006.01)
  *H03K 17/687* (2006.01)
  *H02M 3/337* (2006.01)
  *H02M 3/335* (2006.01)

(52) U.S. Cl.
  CPC ....... *H03K 17/0822* (2013.01); *H03K 17/687* (2013.01); *H02M 3/335* (2013.01); *H02M 3/337* (2013.01); *H02M 3/33507* (2013.01)

(58) Field of Classification Search
  CPC .. H02M 3/335; H02M 3/33507; H02M 3/337; H03K 17/0822; H03K 17/687

USPC .......................................... 323/280–289, 315
See application file for complete search history.

(56) References Cited

U.S. PATENT DOCUMENTS

| | | | |
|---|---|---|---|
| 8,344,806 B1* | 1/2013 | Franck | H03F 3/195 330/285 |
| 9,350,249 B2* | 5/2016 | Valley | H02M 1/4258 |
| 9,496,007 B2* | 11/2016 | Seth | G11C 5/147 |
| 9,651,980 B2* | 5/2017 | Roy | G05F 3/267 |
| 10,014,851 B2* | 7/2018 | Chauhan | G01R 19/0092 |
| 2013/0027815 A1* | 1/2013 | Gaknoki | H02M 1/32 361/18 |

* cited by examiner

*Primary Examiner* — Matthew V Nguyen
*Assistant Examiner* — Nusrat Quddus
(74) *Attorney, Agent, or Firm* — Tuenlap Chan; Charles A. Brill; Frank D. Cimino

(57) ABSTRACT

An apparatus includes an output transistor device configured to control an output voltage of an output node in response to a control signal and an input voltage. A current sensor is configured to sense an output current supplied from the output node. A feedback converter is configured to convert the sensed output current to a feedback signal that tracks the output voltage of the output node. The feedback converter is further configured to set a clamping threshold. A gate control circuit is configured to generate the control signal in response to the feedback signal. The gate control circuit is configured to clamp the output voltage of the output node via the control signal based on the clamping threshold.

19 Claims, 5 Drawing Sheets

OVER-VOLTAGE CLAMP CIRCUIT

CROSS-REFERENCE TO RELATED APPLICATION

This application claims the benefit of India Provisional Patent Application 201741008245 filed on Mar. 9, 2017, and entitled ARCHITECTURE FOR ACCURATE AND FAST INPUT OVER VOLTAGE PROTECTION, the entirety of which is incorporated by reference herein.

TECHNICAL FIELD

This disclosure relates to electrical circuits, and more particularly to an over-voltage clamp circuit.

BACKGROUND

For power delivery circuits, protection of loads against higher than rated input operating voltages is an important feature. Most devices offer this protection by shutting off an output power switch when an input over voltage condition is detected. However, this causes undesired power interruptions to the load during input voltage transients. Hence, users often prefer output voltage clamping instead of output shut-off during such conditions. Clamping circuits are difficult to implement however. For example, the output voltage clamp should have high clamping accuracy, fast response time, suitable system reliability, low area for circuit implementation, and minimum design complexity. Applications for such clamping circuits include e-fuses, load switches, power multiplexors, linear regulators, and so forth.

SUMMARY

This disclosure relates to a circuit configured to clamp and regulate an output voltage based on input over-voltage conditions.

In one example, an apparatus includes an output transistor device configured to control an output voltage of an output node in response to a control signal and an input voltage. A current sensor is configured to sense an output current supplied from the output node. This feedback converter outputs a feedback signal which is in proportion to the Output voltage. A gate control circuit is configured to generate the control signal in response to the feedback signal. The gate control circuit is configured to clamp the output voltage of the output node via the control signal based on the clamping threshold.

In another example, a clamp circuit includes an output transistor device that includes a control terminal, an input terminal, and an output terminal. The clamp circuit includes a current sensor coupled with the output terminal of the output transistor device and a current source coupled to the current sensor. The clamp circuit includes a divider circuit coupled in parallel with the current source. A mirror transistor device is coupled in series with the current source and the divider circuit. The mirror transistor device includes a control terminal that is coupled with the control terminal of the output transistor device. A gate control circuit having an input is coupled to an intermediate node of the divider circuit.

In yet another example, a system includes a mirror circuit configured to control an output voltage of an output node of the clamp system in response to a control signal and an input voltage. A current sensor is configured to provide a current sensor signal based on an output current of the output node. A current source is configured to generate scaled current in response to the current sensor signal. The mirror circuit is configured to provide a feedback signal representing the output voltage based on scaled current of the current source. A sample network is configured to sample the feedback signal and to set a clamping threshold. A controller is configured to generate the control signal in response to the sampled feedback signal. The controller is configured to clamp the output voltage of the output node via the control signal in response to the output voltage exceeding the clamping threshold.

DETAILED DESCRIPTION

Figure 1:
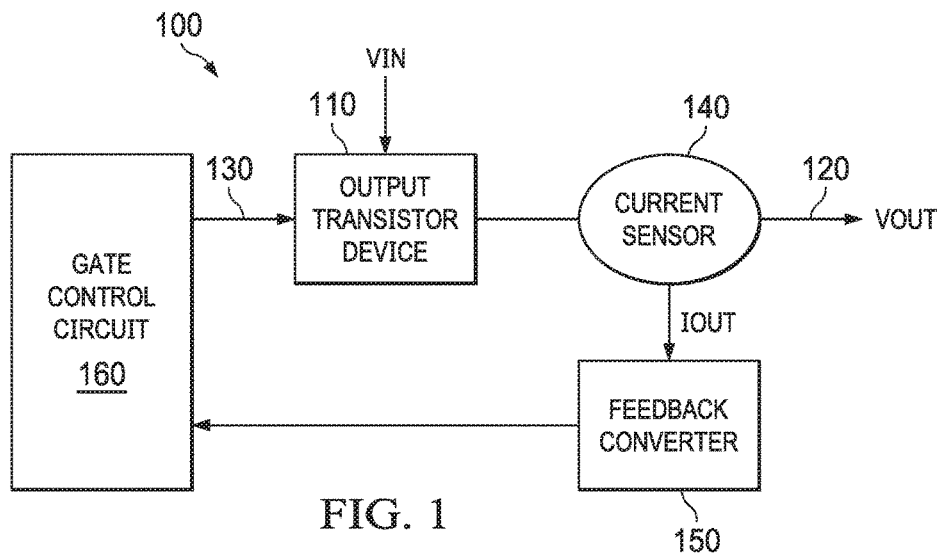
FIG. 1 illustrates an example block diagram of an apparatus to regulate and clamp an output voltage.

This disclosure relates to a clamp circuit configured to regulate and clamp an output voltage, such as in the presence of elevated input voltages that may exceed the desired output voltage. The clamp circuit includes a transistor device that controls an output voltage of an output node in response to a control signal and an input voltage. A current sensor is configured to sense an output current supplied from the output node. In contrast to conventional designs that control the output voltage by directly sensing and controlling the regulator loop around the output voltage, the clamp circuit disclosed herein senses current, which is converted and used to track the output voltage without directly sensing the voltage itself. Since the output voltage is not controlled by sensing the output voltage directly, a pole in the control loop transfer function may be eliminated which increases the speed and stability of the regulator control loop to maintain the output voltage even in the presence of elevated input voltages.

As a further example, sensed current is routed through a mirror transistor which is matched to the main power delivery transistor (also referred to as output transistor device) causing the voltage at the output of the matched transistor to be about equal to the output node of the main power transistor. The ratio of the mirror transistor device and the ratio of sense current scaling can be configured such that the voltage at the output node of the transistor tracks the voltage at the output node of the main power delivery device. The voltage at the output of the matched transistor is applied to the input of a divider where a feedback signal is generated. A gate control circuit sets a clamping threshold which defines the output voltage setting in the presence of raised input voltages. The gate control circuit generates the control signal in response to the feedback signal. The gate control circuit causes the output voltage of the output node to be clamped by issuing the control signal based on the clamping threshold which can be set, for example, via an internal reference and/or feedback divider network in the gate control circuit.

In addition to closing the regulator loop by sensing the output current which removes a control system pole from consideration, various control loop circuits can be controlled via the gate control circuit to facilitate transient stability of the output voltage in the presence of varying input voltages that may exceed the output voltage. As an example, a high gain loop and a high speed loop can be implemented in parallel to facilitate high accuracy and speed concurrently. Additionally or alternatively, to improve regulator speed and transient response, a gate discharge circuit can be configured to facilitate rapid discharging of the output transistor device. Also, an over discharge correction circuit can be provided to control discharging of the gate that controls the output power device to mitigate voltage drooping at the output in the event of over discharging of the gate.

As used herein, the term "circuit" can include a collection of active and/or passive elements that perform a circuit function, such as an analog circuit or control circuit. Additionally or alternatively, for example, the term "circuit" can include an integrated circuit (IC) where all or some of the circuit elements are fabricated on a common substrate (e.g., semiconductor substrate, such as a die or chip).

FIG. 1 illustrates an example of an apparatus 100 to regulate and clamp an output voltage VOUT. The apparatus 100 includes an output transistor device 110 configured to control the output voltage VOUT of an output node 120 in response to a control signal 130 and the input voltage VIN. As used herein, the term transistor device can include any combination of one or more transistors that can include metallic oxide semiconductors such as field effect transistors or other type transistors such as bipolar junction transistors. The apparatus 100 is configured to clamp the output voltage VOUT in the presence of elevated input voltages VIN that may exceed the output voltage.

A current sensor 140 is configured to sense an output current IOUT supplied from the output node 120. A feedback converter 150 is configured to convert the sensed output current IOUT to a feedback signal 154 having a voltage that tracks the output voltage VOUT of the output node 120. The feedback converter 150 is further configured to set a clamping threshold that sets the voltage to which VOUT will be clamped if VIN is raised to a value that exceeds VOUT.

A gate control circuit 160 is configured to generate the control signal 130 in response to the feedback signal 154. The gate control circuit 160 is configured to cause the output voltage VOUT of the output node 120 to be clamped via the control signal 130 based on the clamping threshold and the value of VIN. An example of the feedback converter 150 and other apparatus components are illustrated and described below with reference to FIGS. 2, 3 and 4. An example of the gate control circuit 160 is illustrated and described below with reference to FIGS. 3, 4, and 5.

Figure 2:
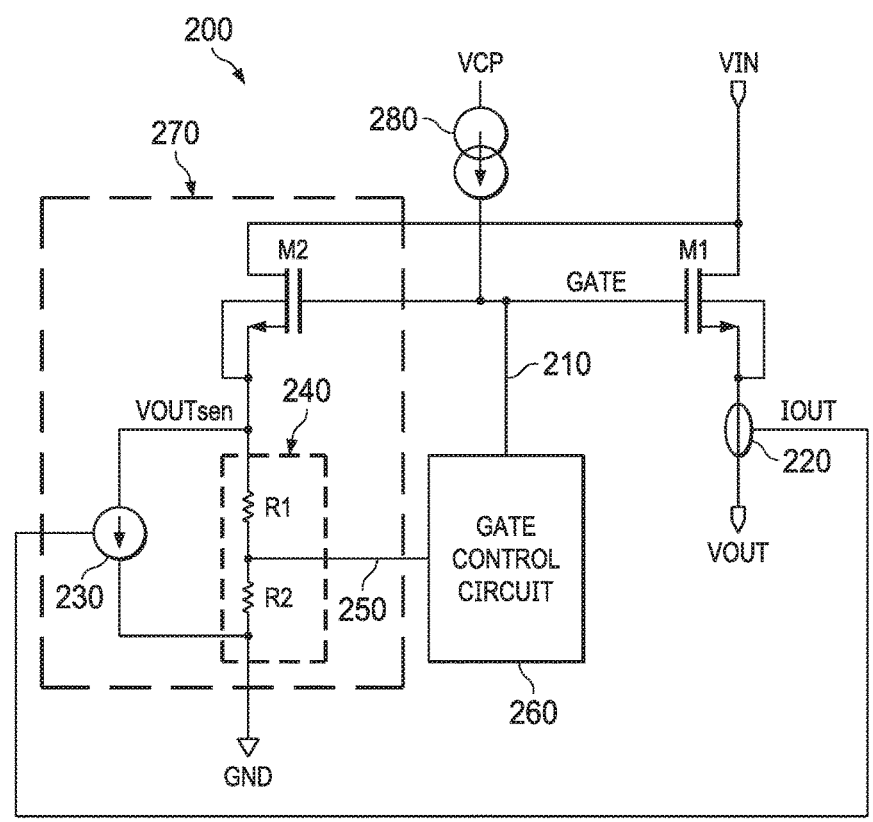
FIG. 2 illustrates an example of a circuit to regulate and clamp an output voltage.

FIG. 2 illustrates an example of a circuit 200 to regulate and clamp an output voltage VOUT in the presence of elevated input voltages VIN that may exceed the desired clamping threshold. The circuit 200 includes an output transistor device M1 that includes a control terminal (e.g., gate), an input terminal (e.g., drain), and an output terminal (e.g., source). The output terminal provides the output voltage VOUT of the clamp circuit 200 in response to the input voltage VIN applied to the input terminal and a control signal 210 applied to the control terminal of M1. A current sensor 220 (e.g., resistive sensor, capacitive sensor, Hall effect sensor or the like) is coupled with the output terminal of the transistor device M1 to sense an output current IOUT of the output terminal. A current source 230 (e.g., three terminal transistor) generates scaled current in response to the sensed output current IOUT. A divider circuit 240 that includes R1 and R2 is coupled in parallel with the current source 230. A mirror transistor device M2 is coupled in series with the current source 230 and the divider circuit 240. The mirror transistor device M2 and divider circuit 240 are configured to convert the scaled current of the current source 230 to a feedback signal 250 representing the output voltage. A gate control circuit 260 receives the feedback signal 250 and causes clamping of the output voltage VOUT of the output node by asserting the control signal 210 if the input voltage VIN exceeds a threshold.

The mirror transistor device M2 is generally much smaller than the power transistor device M1. Thus, M2 is scaled to a ratio of M1 such that M1 is sized X/1 with respect to M2, where X is a positive integer generally greater than 1. As an example, if the ratio were 1000/1 between the current capabilities between M1 and M2, then the current source 230 would be scaled to generate an output current that was 1/1000 than that of the sensed current IOUT from M1. In this example, the mirror device M2 would produce a voltage that tracked or replicated VOUT when approximately 1/1000 of IOUT was applied to its source terminal. Transistor M2, current source 230, and divider circuit 240 can collectively be referred to as a feedback converter 270 which was illustrated and described above with respect to FIG. 1. Charge pump current 280 can be configured to boost the gate of Ml. Such boosting is provided to facilitate that M1 is turned completely on in order to reduce its effective output impedance as much as possible. Other example aspects of the circuit of FIG. 2 are illustrated and described below with respect to FIG. 3.

Figure 3:
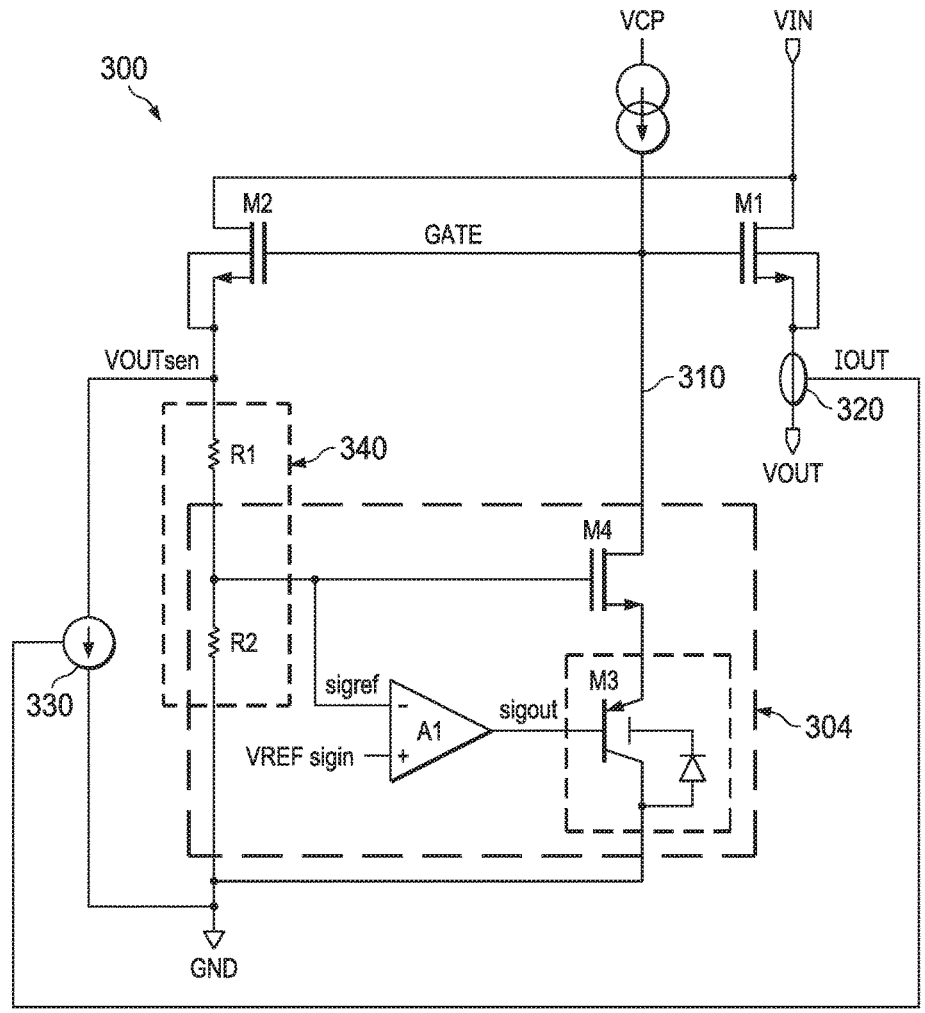
FIG. 3 illustrates an example of a circuit having a gate control circuit to regulate and clamp an output voltage.

FIG. 3 illustrates an example of a circuit 300 having a gate control circuit 304 to regulate and clamp an output voltage VOUT in the presence of elevated input voltages VIN that may exceed the desired clamp threshold. Similar to the circuit 200 described above, the circuit 300 includes an output transistor device M1 that includes a control terminal, an input terminal, and an output terminal. The output terminal of M1 provides the output voltage VOUT of the clamp circuit 300 in response to the input voltage VIN applied to the input terminal and a control signal 310 applied to the control terminal of M1. A current sensor 320 is coupled with the output terminal of the transistor device M1 to sense an output current IOUT of the output terminal. A current source 330 (e.g., three terminal transistor) generates scaled current in response to the sensed output current IOUT. A divider circuit 340 includes R1 and R2 is coupled in parallel with the current source 330. While the divider is shown as a resistive divider, in other examples, other types of divider circuits (e.g., capacitive, transistor) could be utilized. A mirror transistor device M2 is coupled in series with the current source 330 and the divider circuit 340. The mirror transistor device M2 and divider circuit 340 are configured to convert the scaled current of the current source 330 to a feedback signal 350 representing the output voltage. A reference voltage VREF sets the clamping voltage at which VOUT is regulated in the presence of VIN that may exceed VOUT. The resistive values of the divider circuit 340 can also be adjusted to affect the clamping threshold.

The gate control circuit 304 receives the feedback signal 350 and causes the output voltage VOUT of the output node to be clamped via the control signal 310 if the input voltage VIN exceeds a threshold. As shown, the gate control circuit 304 includes an amplifier A1 coupled to an amplifier transistor device M3. The amplifier A1 is configured to set a clamping threshold based on the reference voltage input VREF and the feedback signal 350 from the divider circuit 340. The amplifier transistor device M3 receives output from the amplifier A1. The amplifier A1 and amplifier transistor device M3 are configured to provide a high gain loop to facilitate drive of the control signal 310 of the gate control circuit 304 and to facilitate accuracy of the control signal in response to input voltage variations.

In this example, the gate control circuit 304 also includes a common source transistor device M4 having a source terminal that is coupled to an emitter terminal of the amplifier transistor device M3. The common source transistor device M4 is configured to provide high speed gain loop to drive the control signal 310. High speed is achieved since M4 is controlling the control signal 310 without any intervening stages. Thus, a high gain loop configured from A1 and M3 and a high speed loop configured from M4 generate the control signal 310. In this example, transients at the output of M1 are mitigated via the combination of the high speed loop and the high gain loop being driven concurrently.

Figure 4:
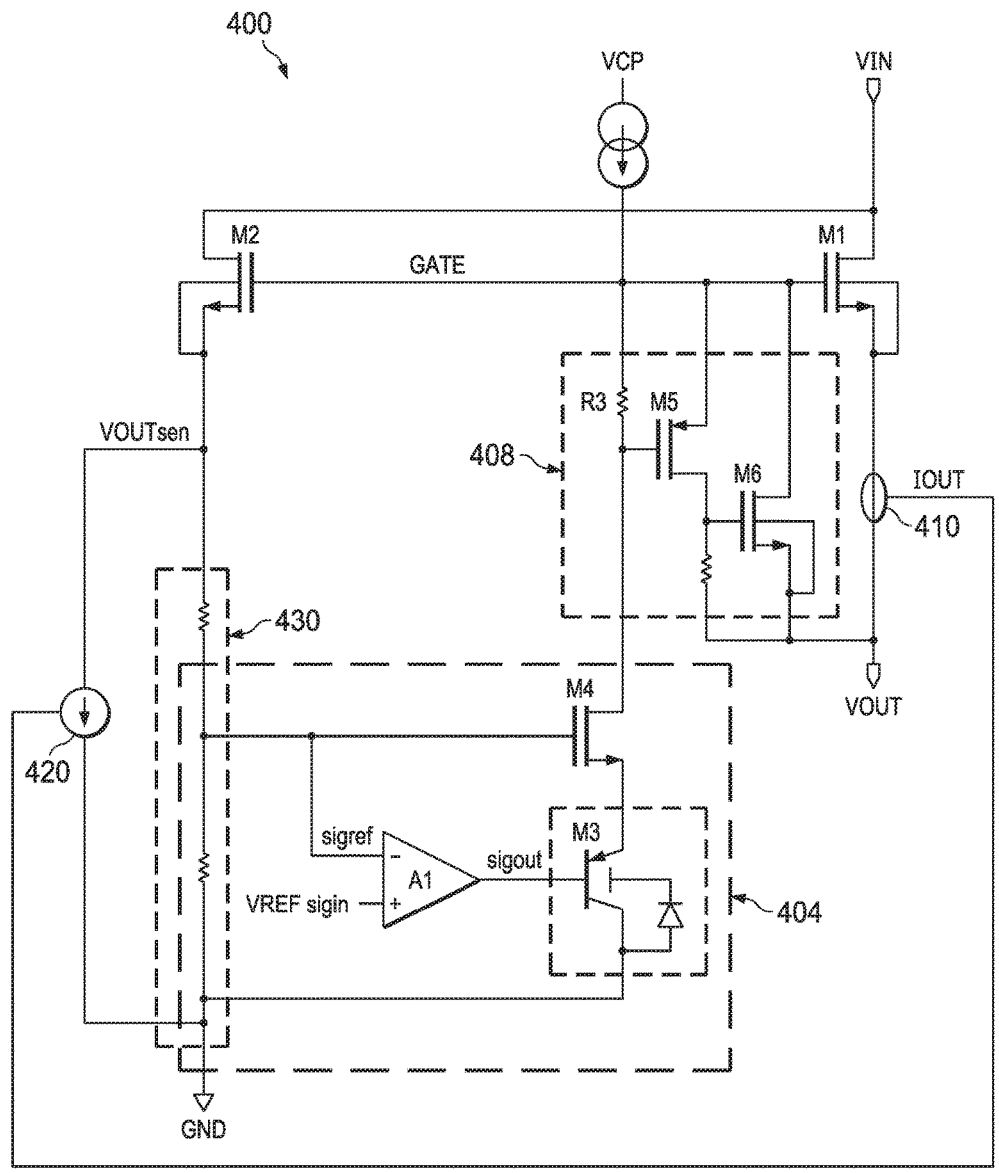
FIG. 4 illustrates an example of a circuit having a gate control with non linear discharge circuit integrated within the feedback loop to regulate and clamp an output voltage.

FIG. 4 illustrates an example of a circuit 400 having a gate control circuit 404 and a gate discharge circuit 408 to regulate and clamp an output voltage VOUT in the presence of elevated input voltages VIN that may exceed the desired clamp voltage. In addition to the gate control circuit 404 that includes amplifier A1 and transistors M3 and M4, the circuit 400 can also include mirror transistors M1 and M2, current sensor 410, current source 420, and feedback circuit 430 that operate collectively as previously described.

The gate discharge circuit 408 is configured to facilitate rapid discharge of the gate to source capacitance of M1 in addition to the feedback loop based discharge facilitated by M3 and M4, which improves the transient response and the stability of the circuit 400. As shown, the gate discharge circuit 408 includes a sense resistor R3 coupled to the output of the source transistor device M4 to set a threshold for the turn-on time of the gate discharge circuit. The gate discharge circuit 408 includes a first discharge transistor M5 configured to turn-on based on the current of the sense resistor R3. A second discharge transistor M6 is coupled to the output of the first discharge transistor M5. The second discharge transistor device M6 discharges the transistor device M1 in response to the output of the first discharge transistor device M5. In one example, parameters of the second discharge transistor M6 and the transistor device M1 are configured to be substantially matched (e.g., +/−1%) to mitigate over discharging of the output transistor device. The circuit 500 of FIG. 5 thus is configured to mitigate the occurrence of over discharging of the gate of transistor device Ml.

Figure 5:
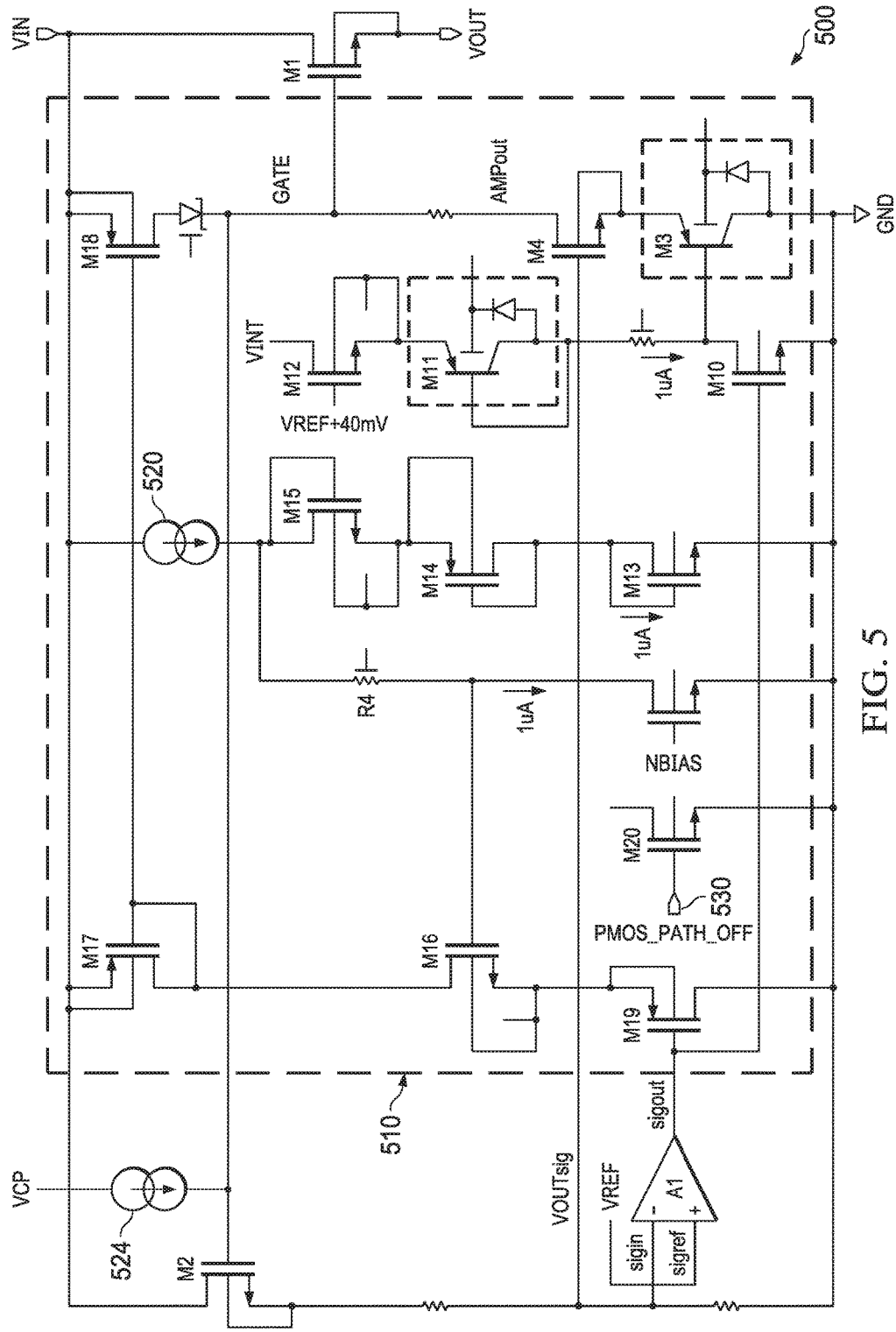
FIG. 5 illustrates an example of a circuit having a gate control and gate over discharge correction circuit to regulate output voltage drooping.

FIG. 5 illustrates an example of a correction circuit 500 having a gate charging circuit to charge the gate in the event of gate over discharge. Circuit 510 facilitates that both gate charging and discharging path are not operating at the same time causing a shoot through current. During fast discharge of transistor device M1, due to potential Vgs mismatch between discharging transistor device M6 main output transistor device M1, there could be an over-discharge of gate-to-source voltage. This can cause the output current from the output transistor device to be lower than the current demanded by the load. In this case, VOUT may go lower than desired. This over discharge should be rapidly corrected to arrest VOUT drooping. However, the gate charging current is usually limited. This is due to the current being provided by a charge pump with limited output driving strength owing to limited charge pump implementation area, either inside an integrated circuit or using discrete components.

In the example of FIG. 5, the over discharge correction circuit 510 includes transistors M10, M11, and M12. These transistors M10, M11, and M12 are generally incorporated into the output stage of A1 but are pulled out of A1 in this example to demonstrate circuit operations. Transistors M1, M2, M3, and M4 operate as described herein. Transistors M13, M14, M15, M16, along with resistor R4 receive a current established by transistor NBIAS, and bias current 520 which is supplied from VIN. This current set via M13 to M16 is provided to track the voltage across the gate-to-source voltage of M10, such that if M10 is on, M19 is off and vice versa. M10 and M19 should be in opposite states to mitigate current shoot-thru in the circuit 500. When transistor M19 and M16 is on, mirror transistors M17 and M18 are enabled to switch VIN to supply gate current (in addition to the current supplied by charge pump current 524) to the gate connection of M1 and M2 to mitigate potential output voltage drooping during rapid discharge of the gate connection.

In the event of over discharge of the gate during periods of fast discharge, the bias current 524 may not be capable of sourcing the gate charging current. As a result, the over discharge circuit is configured to switch VIN via transistors M17 and M18 to provide the current in addition to the charge pump current 520. In some examples, such as to afford proper circuit operations (e.g., to allow the voltage on M10 to be similar to M19), the following transistor pairs can be parameter-matched (e.g., transistor size, area dimensions, current ratings, voltage ratings matched to within 1%) including pairs M10/M13, M3/M11, M4/12, M14/M19, and M15/M16.

The over discharge correction circuit 510 can be configured to charge the gate voltage of the output transistor device in the event of gate over discharge. Also, the over discharge correction circuit 510 includes a path-off input 530 to disable the over voltage discharge correction circuit if the input voltage is less than the output voltage (e.g., during non over voltage clamp conditions). The path-off input 530 can be driven via an external controller, comparator, or control circuit (not shown) that monitors whether VIN and hence VOUT exceeds the desired clamp threshold and sets or resets the signal 530 based on that condition. If VIN is greater than the desired clamp threshold, the path-off signal 530 can be set low, for example, to disable MN20 and enable the over voltage discharge correction circuit 510. If VIN is less than the desired clamp threshold, the path-off signal 530 can be set to high to enable MN20 and disable the over voltage discharge correction circuit 510.

Figure 6:
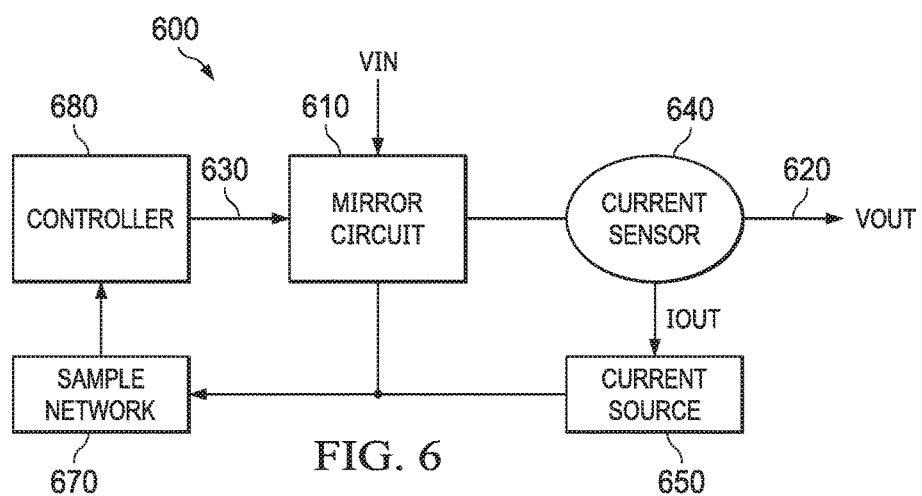
FIG. 6 illustrates an example block diagram of a system to regulate and clamp an output voltage.

FIG. 6 illustrates an example of a system 600 to regulate and clamp an output voltage, such as in the presence of elevated input voltages that may exceed the output voltage. The system includes a mirror circuit 610 (e.g., transistors m1 and M2 previously described) configured to control an output voltage VOUT of an output node 620 of the clamp system 600 in response to a control signal 630 and an input voltage VIN. A current sensor 640 is configured to provide a current sensor signal IOUT based on an output current of the output node 620. A current source 650 is configured to generate scaled current in response to the current sensor signal IOUT. The mirror circuit 610 is configured to provide a feedback signal 660 representing the output voltage based on scaled current of the current source 650. A sample network 670 is configured to sample the feedback signal 660

(e.g., divider network described previously) and to set a clamping threshold. A controller 680 (e.g., gate control circuit described previously) is configured to generate the control signal in response to the sampled feedback signal. The controller 680 is configured to clamp the output voltage VOUT of the output node 620 via the control signal 630 in response to the output voltage VOUT exceeding the clamping threshold. Although not shown, a gate discharge circuit can be configured to facilitate discharging gate capacitance of a transistor device in the mirror circuit. An over discharge circuit can be provided that is configured to detect when the input voltage has exceeded the output voltage and to enable the gate discharge circuit to discharge the output transistor device during elevated input voltage conditions.

Figure 7:
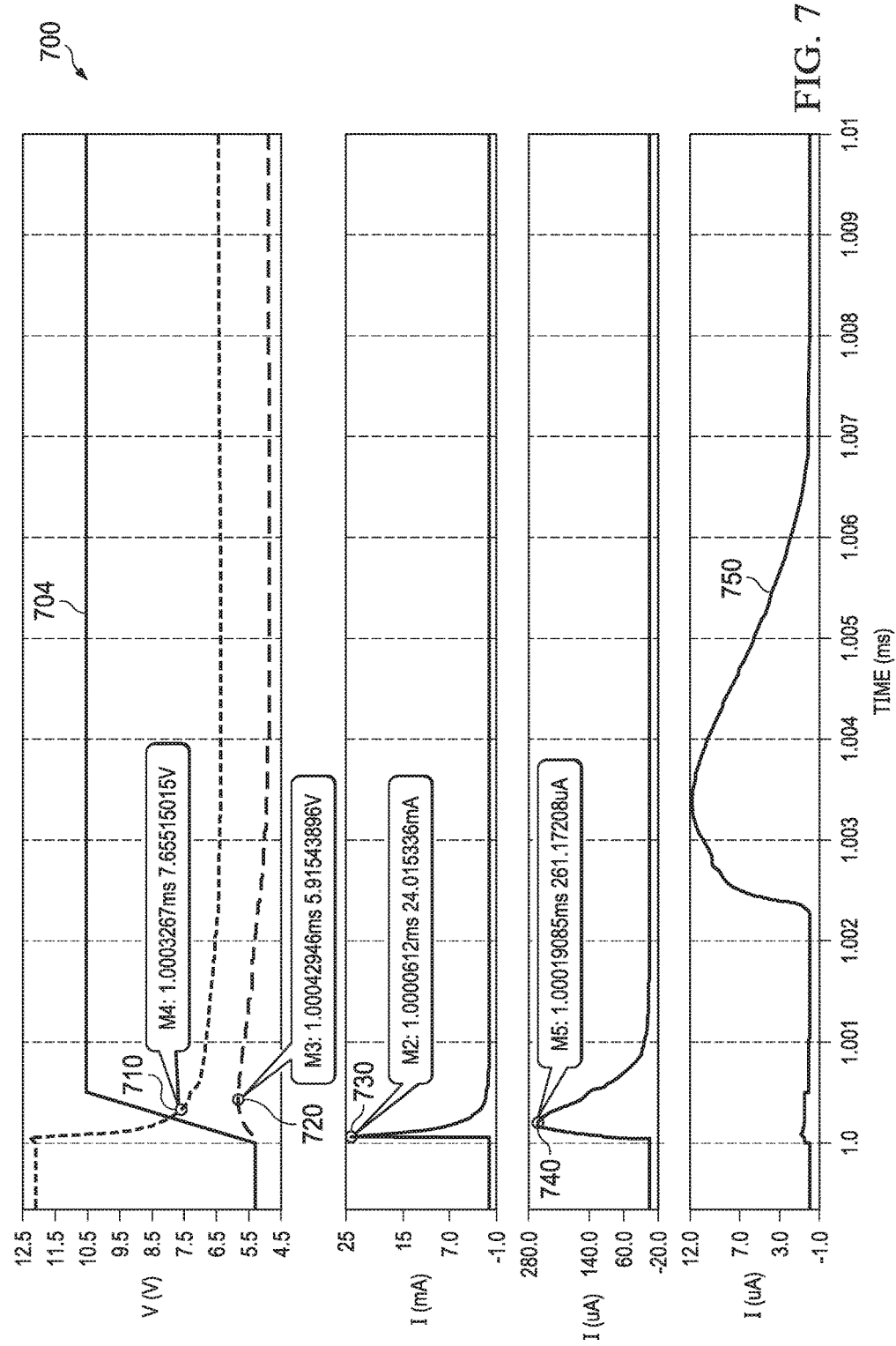
FIG. 7 illustrates a signal diagram depicting example voltage regulation and transient response of the example circuits described herein.

FIG. 7 illustrates a signal diagram 700 depicting example voltage clamping to 5.7V (or other value), for example, and transient response of the circuits described herein. Voltages and currents of different aforementioned components is represented on the vertical axis of the diagram 700 versus time represented on the horizontal axis. At 704, a voltage transient is illustrated where VIN goes from 5.5 V to 10.5 V in 0.5 microseconds (µS) which is a 10V/µS ramp rate. At point 710, it is shown that the gate of M1 reaches about 80% of its final value within about 330 ns. At point 720, VOUT increases by 0.2 V even when VIN increases about 10V/ microsecond (us). At 730, a gate discharge circuit described herein has reacted within 50 nS to provide bulk discharge capabilities. At 740, a slow but controlled discharge of the gate of M1 is shown. At 750, gate charging current being sourced from VIN as switched by the over discharge correction circuit described herein is shown.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An apparatus, comprising:
   an output transistor device configured to control an output voltage of an output node in response to a control signal and an input voltage;
   a current sensor configured to sense an output current supplied from the output node;
   a feedback converter configured to convert the sensed output current to a feedback signal that tracks the output voltage of the output node, the feedback converter further configured to set a clamping threshold; and
   a gate control circuit configured to generate the control signal in response to the feedback signal, the gate control circuit further configured to clamp the output voltage of the output node via the control signal based on the clamping threshold,
   wherein the feedback converter includes a mirror transistor and a controlled current source, the controlled current source is configured to receive the sensed output current and configured to scale the sensed output current to a scaled current that is provided to the mirror transistor, the mirror transistor is configured to generate a tracking voltage that replicates the output voltage in response to the scaled current and based on the control signal.

2. The apparatus of claim 1, wherein the feedback converter includes a divider circuit coupled in parallel with the controlled current source, the divider circuit is configured to generate the feedback signal to the gate control circuit in response to the tracking voltage from the mirror transistor.

3. The apparatus of claim 2, wherein the gate control circuit further comprises an amplifier coupled to an amplifier transistor device, the amplifier configured to set the clamping threshold based on a reference voltage input and the feedback signal from the divider circuit, the amplifier transistor device configured to receive an amplified output from the amplifier and is configured with a frequency response of about zero hertz, the amplifier and the amplifier transistor device configured to provide a high direct current gain loop to facilitate drive of the control signal of the gate control circuit and configured to enable direct current accuracy of the control signal in response to variations in the input voltage.

4. The apparatus of claim 3, wherein the gate control circuit further comprises a common source transistor device having a source terminal that is coupled to a source terminal of the amplifier transistor device, the common source transistor device is configured to provide a common source gain stage that is driven from the amplifier transistor device to facilitate a high speed gain loop to drive the control signal.

5. The apparatus of claim 4, further comprising a gate discharge circuit configured to facilitate discharging gate capacitance of the output transistor device, the gate discharge circuit includes a sense resistor coupled to the output of the common source transistor device and is configured to set a threshold for the turn-on time of the gate discharge circuit.

6. The apparatus of claim 5, the gate discharge circuit includes a first discharge transistor device configured to turn-on based on the current of the sense resistor and a second discharge transistor device coupled to the output of the first discharge transistor device, the second discharge transistor device configured to discharge the output transistor device in response to the output of the first discharge transistor device.

7. The apparatus of claim 6, wherein parameters of the second discharge transistor device and the output transistor device are configured to be substantially matched to mitigate over discharging of the output transistor device.

8. The apparatus of claim 5, further comprising an over discharge correction circuit that is configured to charge a gate voltage of the output transistor device in the event of gate over discharge.

9. The apparatus of claim 8, wherein the over discharge correction circuit includes an input to disable the over discharge correction circuit if the input voltage is less than the clamping threshold.

10. A clamp circuit, comprising:
    an output transistor device that includes a control terminal, an input terminal, and an output terminal;
    a current sensor coupled with the output terminal of the output transistor device;
    a current source coupled to the current sensor;
    a divider circuit coupled in parallel with the current source;
    a mirror transistor device coupled in series with the current source and the divider circuit, the mirror transistor device including a control terminal that is coupled with the control terminal of the output transistor device; and a gate control circuit having an input coupled to an intermediate node of the divider circuit.

11. The clamp circuit of claim 10, wherein the output terminal of the output transistor device is configured to provide an output voltage of the clamp circuit in response to an input voltage applied to the input terminal and a control signal applied to the control terminal of the output transistor device, wherein the current sensor is configured to provide a sensor signal representing an output current of the output terminal, wherein the current source is configured to generate scaled current in response to the sensor signal, wherein the mirror transistor device and the divider circuit are configured to convert the scaled current of the current source to a feedback signal at the intermediate of the divider circuit corresponding to the output voltage, and wherein the gate control circuit is configured to provide the control signal to the control terminal based on the feedback signal such that the output voltage at the output terminal is clamped if the input voltage exceeds a clamping threshold.

12. The circuit of claim 11, wherein the gate control circuit further comprises an amplifier coupled to an amplifier transistor device, the amplifier configured to set the clamping threshold based on a reference voltage input and configured to receive the feedback signal from the divider circuit, the amplifier transistor device configured to receive an amplified output from the amplifier and is configured with a frequency response of about zero hertz, the amplifier and amplifier transistor device being configured to provide a direct current gain loop to facilitate drive of the control signal of the gate control circuit and configured to enable direct current accuracy of the control signal in response to input voltage variations.

13. The circuit of claim 12, wherein the gate control circuit further comprises a common source transistor device having a source terminal that is coupled to a source terminal of the amplifier transistor device, the common source transistor device is configured to provide a common source gain stage that is driven from the amplifier transistor device to facilitate a high speed gain loop to drive the control signal.

14. The circuit of claim 13, further comprising a gate discharge circuit configured to facilitate discharging gate capacitance of the output transistor device, the gate discharge circuit includes a sense resistor coupled to the output of the common source transistor device and configured to set a threshold for the turn-on time of the gate discharge circuit.

15. The circuit of claim 14, the gate discharge circuit includes a first discharge transistor configured to turn-on based on the current of the sense resistor and a second discharge transistor coupled to the output of the first discharge transistor, the second discharge transistor configured to discharge the output transistor device in response to the output of the first discharge transistor.

16. The circuit of claim 14, further comprising an over discharge correction circuit that is configured to charge a gate voltage of the output transistor device in the event of gate over discharge.

17. The circuit of claim 16, wherein the over discharge correction circuit includes an input to disable the over discharge correction circuit if the input voltage is less than the clamping threshold.

18. A clamp system, comprising:

a mirror circuit configured to control an output voltage of an output node of the clamp system in response to a control signal and an input voltage;

a current sensor configured to provide a current sensor signal based on an output current of the output node;

a current source configured to generate scaled current in response to the current sensor signal, wherein the mirror circuit is configured to provide a feedback signal representing the output voltage based on scaled current of the current source;

a sample network configured to sample the feedback signal and to set a clamping threshold; and a controller configured to generate the control signal in response to the sampled feedback signal, the controller configured to clamp the output voltage of the output node via the control signal in response to the output voltage exceeding the clamping threshold.

19. The system of claim 18, further comprising a gate discharge circuit configured to facilitate discharging gate capacitance of a transistor device in the mirror circuit and an over discharge correction circuit that is configured to charge a gate voltage of the output transistor device in the event of gate over discharge.

* * * * *